United States Patent [19]

Reynolds

[11] Patent Number: 4,825,109

[45] Date of Patent: Apr. 25, 1989

[54] DIGITAL DELAY CIRCUIT

[75] Inventor: Charles A. Reynolds, West Haven, Conn.

[73] Assignee: American Home Products Corporation, N.Y.

[21] Appl. No.: 124,417

[22] Filed: Nov. 20, 1987

Related U.S. Application Data

[63] Continuation of Ser. No. 873,932, Jun. 13, 1986.

[51] Int. Cl.$^4$ .......................... H03K 5/06; H03K 5/04
[52] U.S. Cl. ..................... 307/601; 307/602; 307/596; 307/606; 328/55
[58] Field of Search ................... 307/596–608, 307/590, 592; 328/55, 155, 104

[56] References Cited

U.S. PATENT DOCUMENTS

| | | | |
|---|---|---|---|
| 3,657,658 | 4/1972 | Kubo | 328/104 |
| 3,889,186 | 6/1975 | Larson | 328/155 |
| 4,400,666 | 8/1983 | Sekiquchi | 307/602 |
| 4,443,765 | 4/1984 | Findeisen et al. | 328/55 |
| 4,626,716 | 12/1986 | Miki | 307/602 |
| 4,638,256 | 1/1987 | Hong | 328/55 |
| 4,675,546 | 6/1987 | Shaw | 307/601 |
| 4,677,499 | 6/1987 | Shirota et al. | 307/602 |
| 4,719,375 | 1/1988 | Martin | 307/600 |

Primary Examiner—Stanley D. Miller
Assistant Examiner—Nancy Thai
Attorney, Agent, or Firm—Darby & Darby

[57] ABSTRACT

For controlling the firing of an electroacoustic transducer used in providing an ultrasound image of a fetus under examination, a programmable digital delay circuit includes a clock generator whose output is supplied to a delay line so as to provide a plurality of waveforms shifted in time from one another and from the waveform generated by the clock generator. Depending on the delay desired prior to firing the transducer, one of the five waveforms may be not be inverted and thereafter used for triggering a counter whose output switches logic gates for enabling a buffer and pulse shaper to fire the transducer.

6 Claims, 4 Drawing Sheets

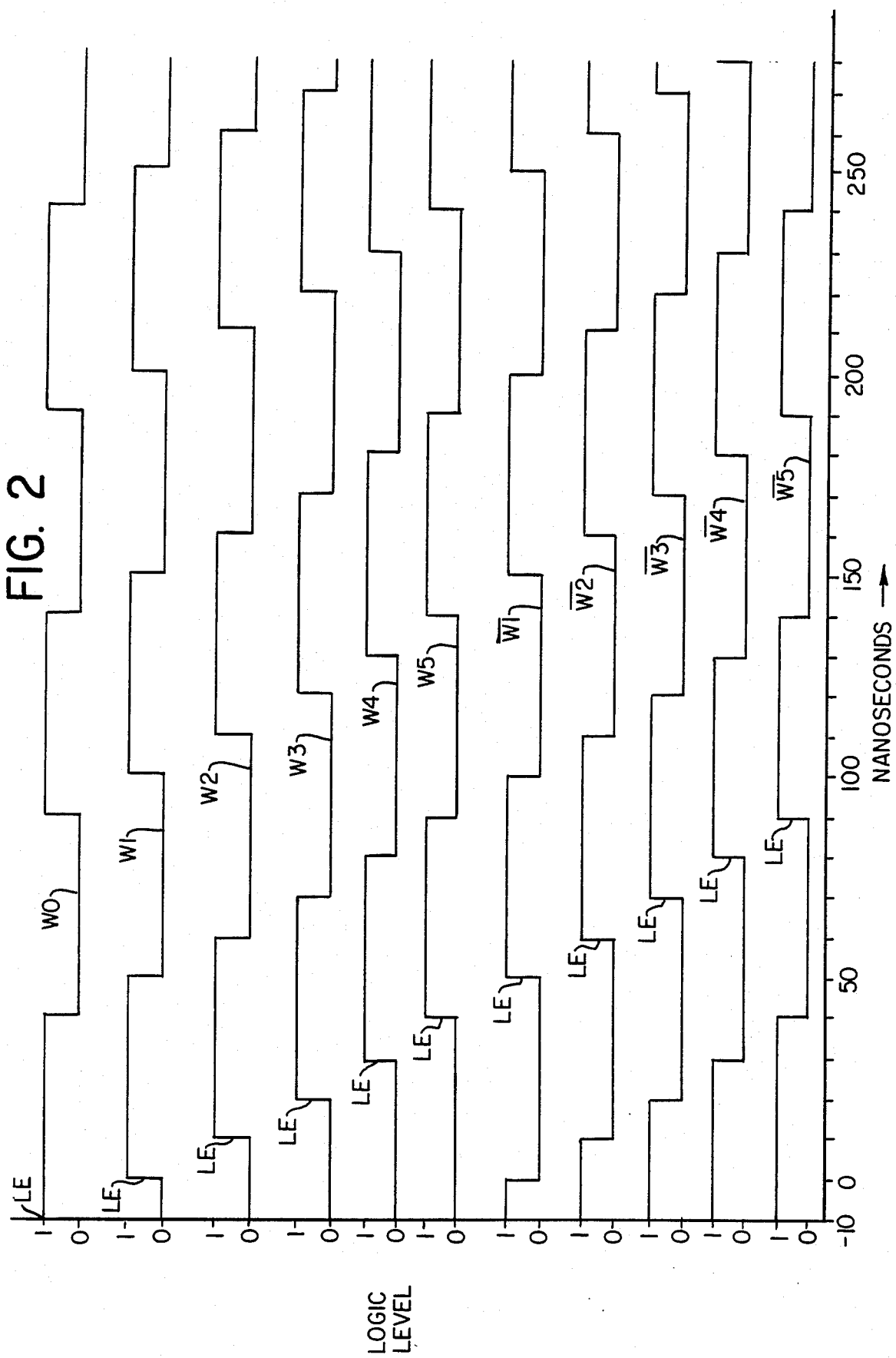

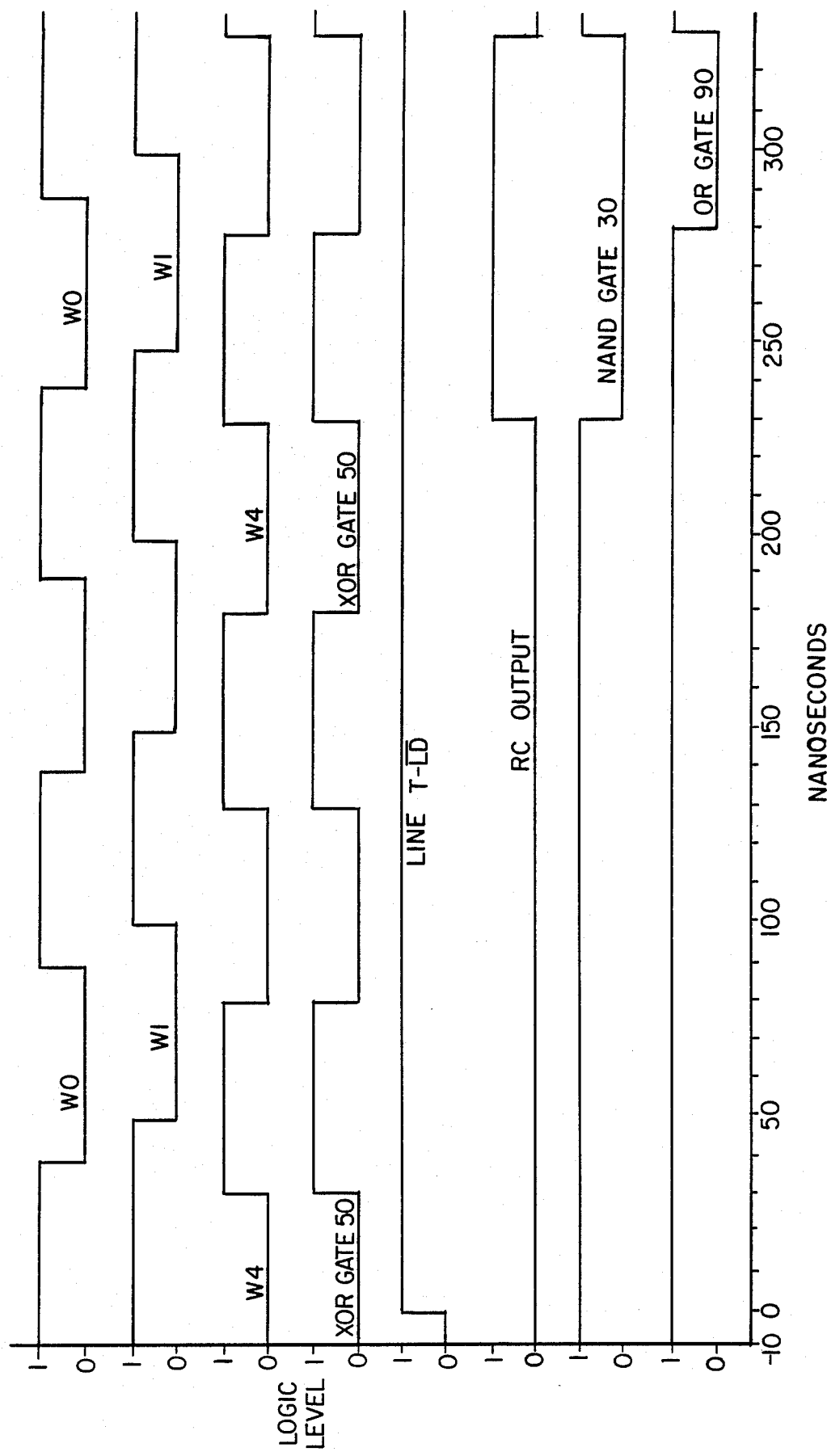

DIGITAL DELAY CIRCUIT

This is a continuation of application Ser. No. 873,932, filed June 13, 1986.

BACKGROUND OF THE INVENTION

1. Field of the Invention

The present invention relates to delay circuits and more particularly is directed toward programmable digital delay circuits which have a variety of applications including, but not limited to, use in ultrasound imaging devices.

2. Description of the Prior Art

Ultrasound imaging devices are often used in examining a fetus, a particular internal organ or other object within a patient. The devices employ one or more electroacoustic transducers each of which has one or more small areas/faces otherwise known as elements which together form an aperature and from which ultrasound waves are propagated to form a beam of ultrasound energy. The beam is created by applying an electrical pulse across each element in order to cause a mechanical deformation of the latter resulting in the radiation of ultrasound waves from a preselected group of elements. For purposes of focusing and steering an ultrasound beam radiating from the preselected group of elements, the electrical pulses applied to the elements are staggered in time rather than applied to all of the elements at the same time. Such staggering requires that one or more elements within the preselected group be electrically energized (i.e. fired) at different times from one another through the use of delay circuits. These delay circuits are connected between a pulse generator and the elements whose firing times are to be delayed.

As the number of elements within the group increases, the capability for steering or focusing the beam increases. In addition, as the number of elements within the group increases, the depth at which an image has an acceptable resolution increases. Therefore, it is highly desirable to increase the number of elements within the group to be fired. Of course, as the number of elements increase, the number of delay circuits also will increase.

Delay lines used in delay circuits which are designed to delay the energization of transducers whose elements are arranged in the form of a linear array typically provide between 0–500 nanosecond delay periods and are normally rated with a tolerance of ±5 percent. Therefore, a delay line which is nominally rated at 500 nanoseconds may, in fact, delay an electrical pulse by as much as 525 nanoseconds or by as little as 475 nanoseconds. If two elements are to be fired after a 500 nanosecond delay but, in fact, due to the manufacturing tolerances of the delay lines fire at 525 and 475 nanoseconds, the corresponding ultrasound waves produced rather than being in phase with each other will be out of phase with each other by a 50 nanosecond deviation. As can be readily appreciated such manufacturing variations between the same nominally rated delay lines is quite undesirable and makes steering or focusing of the beam quite difficult if not impossible.

In order to more closely match the nominal rating of the delay line requires the manufacturing tolerances be greatly reduced to, for example, ±1 percent resulting in much more expensive delay lines. As discussed above, there is now a much greater emphasis on increasing the number of elements used for generating an ultrasouond beam. Accordingly, the cost of more expensive delay lines is much more unattractive, and may be cost prohibitive.

OBJECTS AND SUMMARY OF THE INVENTION

It is an object of the present invention to provide a delay circuit which avoids the above-mentioned prior art drawbacks.

More specifically, is an object of the invention to provide a delay circuit which is extremely close to its nominal rating.

It is another object of the present invention to provide a delay circuit which is not costly to manufacture.

In accordance with an aspect of this invention for producing a delay signal after a predetermined period of time has elapsed, a device comprises generating means for generating a periodic waveform; means for producing one or more waveforms shifted in time relative to the periodic waveform wherein each of the one or more time shifted waveforms has leading and trailing edges; selecting means for choosing between the leading and trailing edges of the one or more time shifted waveforms to serve as one or more clock signals; and means for counting the one or more clock signals and for producing the delay signal in response to the count reaching a predetermined count value.

In a feature of the present invention, the selecting means comprises switching means for choosing between two or more time shifted waveforms and gating means operable for inverting the time shifted waveform chosen by the switching means.

In yet another feature of the present invention, the device further comprises shift register means for controlling the selecting means and for providing the initial count value at which to begin counting the clock signals.

In accordance with another aspect of the present invention, a method for producing a delay signal after a predetermined period of time has elapsed comprises generating a periodic waveform; producing one or more waveforms shifted in time relative to the periodic waveform wherein each of said one or more waveforms shifted in time has leading and trailing edges; selecting between the leading and trailing edges of said one or more time shifted waveforms to serve as one or more clock signals; counting the one or more clock signals; and producing the delay signal in response to the count reaching a predetermined value.

In a feature of the latter aspect of the present invention, the step of selecting comprises choosing between two or more time shifted waveforms and determining whether to invert the chosen waveform. The above, and other objects features and advantages of this invention will become apparent from the following detailed description which is to be read in conjunction with the accompanying drawings wherein like reference numerals refer to the same elements.

BRIEF DESCRIPTION OF THE DRAWINGS

FIG. 2 is a timing chart illustrating graphically various waveforms produced by the delay circuit of FIGS. 1A and 1B; and FIG. 3 is a timing chart illustrating graphically certain waveforms produced by FIGS. 1A and 1B for a two hundred and thirty nanosecond delay.

DETAILED DESCRIPTION OF A PREFERRED EMBODIMENT

Figure 1A:
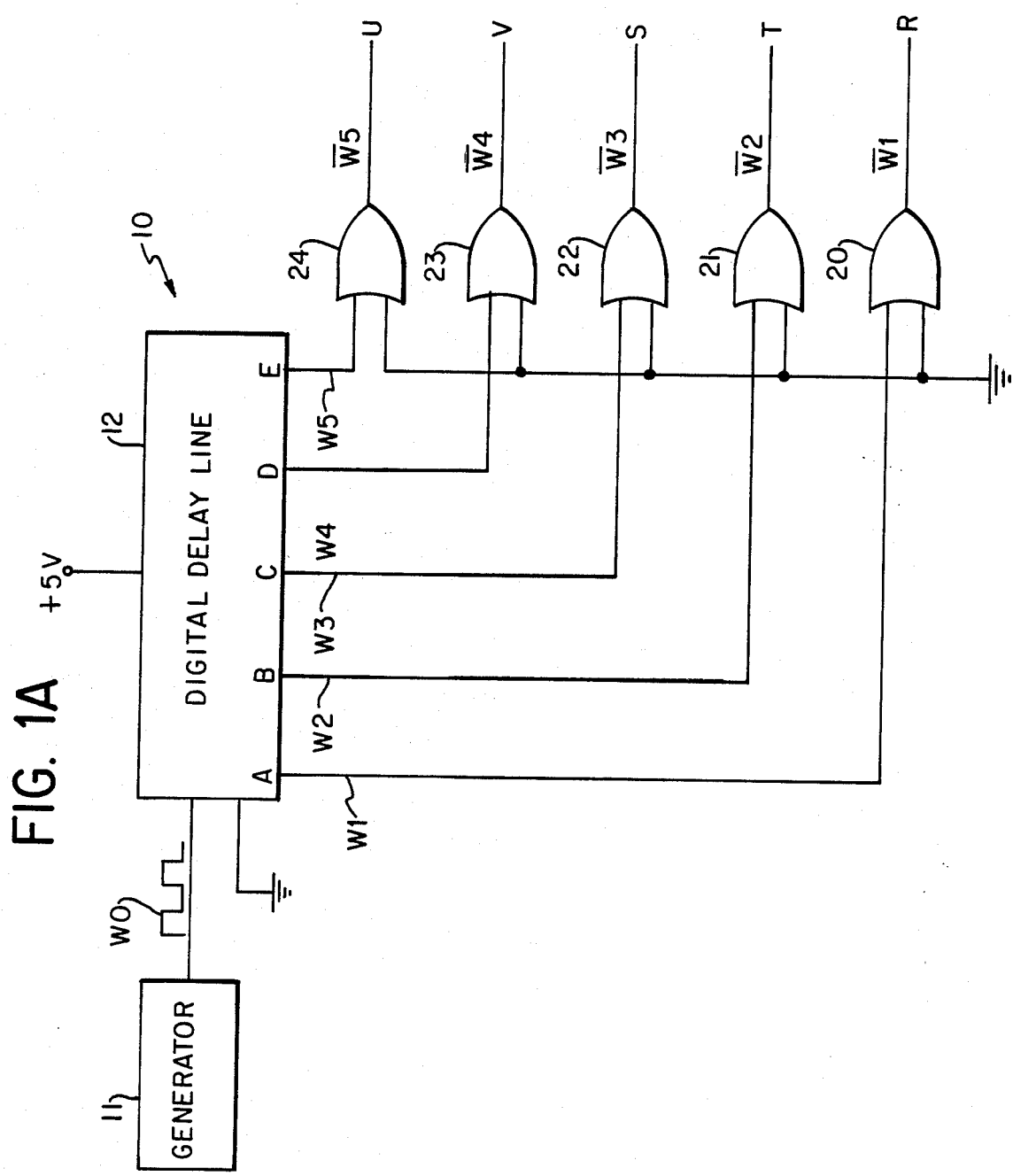
FIGS. 1A and 1B are schematic diagrams, partially in block form, of a programmable digital delay circuit in accordance with an embodiment of the present invention.
Figure 1B:
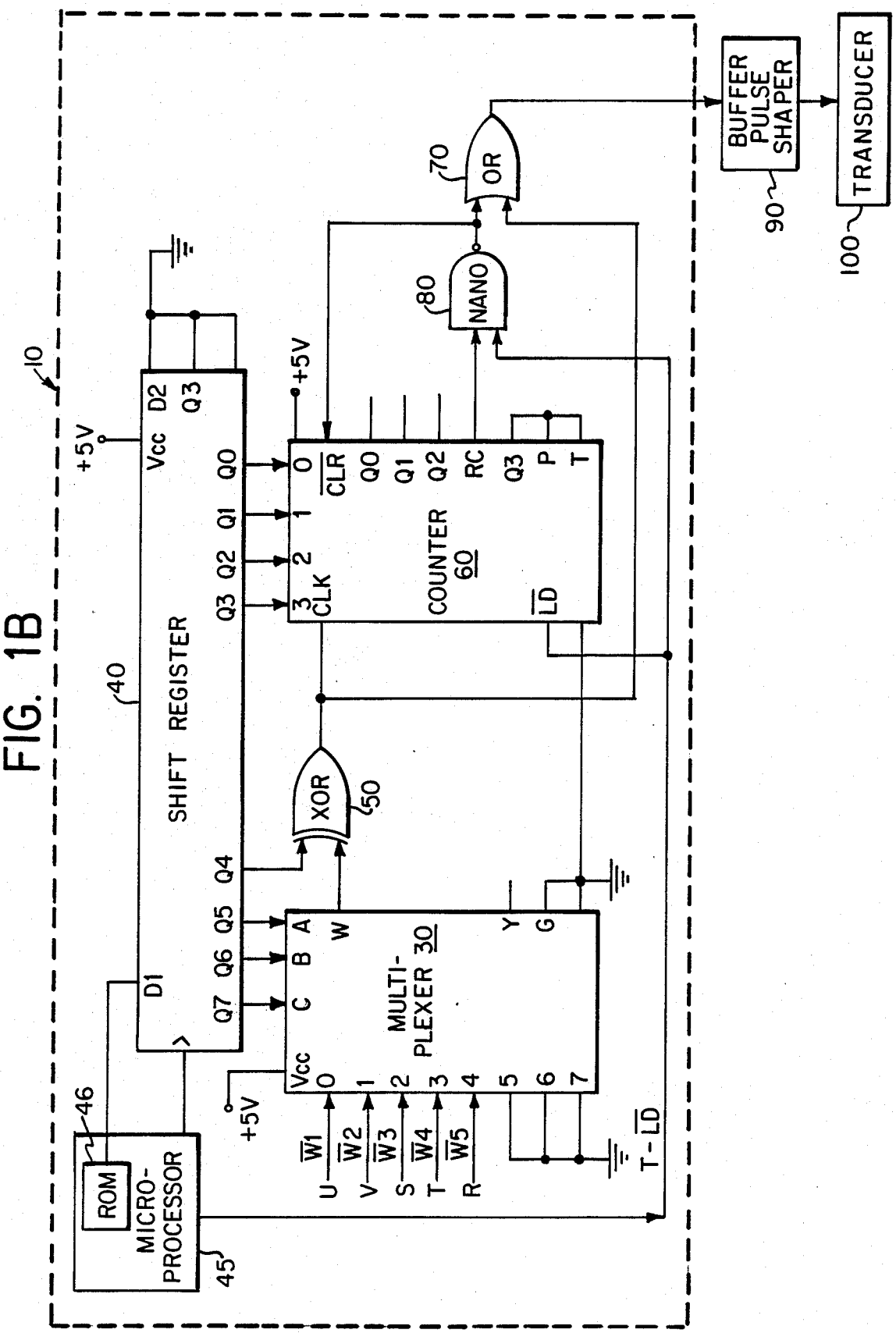

Referring now to FIGS. 1A and 1B, a portion of the digital delay device 10 includes a clock generator 11 which produces a digitized ten megahertz (mHz) square wave signal hereinafter referred to as $w_0$. One type of clock generator which can be used is a gated oscillator having a fifty nanosecond period during which the square wave is at its maximum amplitude and a fifty nanosecond period during which the square wave is at its minimum amplitude. The ten mHz signal $w_0$ is coupled to a digital delay line 12 which is essentially an analog delay line comprised of inductors, resistors and capacitors with logic gates at its input and output. Delay line 12 is a commercially available, off the shelf item identified as part no. DT14CB500 from Kappa Networks Inc. of Carteret, N.J. Delay line 12 has 5 output taps (A, B, C, D and E) for shifting in time the ten mHz signal $w_0$ by ten, twenty, thirty, forty and fifty nanoseconds. The output waveforms supplied by taps A, B, C, D and E are shown in FIG. 2 as $w_1$, $w_2$, $w_3$, $w_4$ and $w_5$ and correspond to time shifts relative to waveform $w_o$ of ten, twenty, thirty, forty and fifty nanoseconds, respectively. As used herein, however, $w_1$ is considered to be at zero delay, and all other waveforms are relative to $w_1$. Thus $w_0 = -10$, $w_1 = 0$, $w_2 = 10$, $w_3 = 20$, $w_4 = 30$, and $w_5 = 40$, nanosecond delay. Connected to taps A, B, C, D and E is one input from buffer inverters 20, 21, 22, 23 and 24, respectively. The second input terminal of each of these five buffer inverters is connected to ground. Buffer inverters 20–24, which invert the waveforms supplied at their input terminals, are each commercially available as part no. 74128 from Texas Instruments Corp. of Dallas, Tex.

The outputs from buffer inverters 20, 21, 22, 23 and 24 are designated as $\overline{w}_1$, $\overline{w}_2$, $\overline{w}_3$, $\overline{w}_4$ and $\overline{w}_5$, respectively, wherein "-" over a waveform represents that the waveform has been inverted, and are connected to inputs 0, 1, 2, 3 and 4 of a multiplexer 30, respectively. Buffer inverters 20-24 are particular chosen for impedance matching to multiplexer 30. Multiplexer 30, which also inverts the waveform selected, is commercially available as part no. AS151 from Texas Instruments Corp. A +5 volt power supply is connected to the $V_{cc}$ pin of multiplexer 30. Pins A, B and C of multiplexer 30 are connected to outputs $Q_5$, $Q_6$, $Q_7$ of a shift register 40, respectively. An output W is connected to one of the inputs of an exclusive OR (XOR) gate 50 while the other input of XOR gate 50 is connected to output $Q_4$ of shift register 40. XOR gate 50 is commercially available as part no. F86 from Fairchild Camera and Instrument Corp. of Mountain View, Calif. Pins (5, 6, 7, $\overline{G}$ and GND) of multiplexer 30 are connected to ground. Pin Y is not used. Shift register 40, which comprises two 4 bit serial shift registers, is commercially available as part no. 4015 from Texas Instruments Corp. A clock signal and digital data (instructions) are received by shift register 40 from a microprocessor 45 at inputs > and input $D_1$, respectively. The instructions, which will be explained in detail below, are stored within a ROM 46 of microprocessor 45. The shift register is powered by a +5 volt power supply which is connected to a pin $V_{cc}$ of shift register 40. Pin $D_2$ and output $Q_3$ of shift register 40 are tied together. Outputs $Q_0$, $Q_1$, $Q_2$ and $Q_3$ of shift register 40 are connected to load data inputs 0, 1, 2, 3 of a counter 60, respectively. Counter 60 is an off the shelf item commercially available as part no. ALS163 from Texas Instruments Corp. Pin GND of counter 60 is grounded and pins $Q_0$, $Q_1$ and $Q_2$ of counter 60 are not used. The output from XOR gate 50 is connected to the clock input (CLK) of counter 60. Connected between microprocessor 45 and an input terminal $\overline{LD}$ of counter 60 is a line T-$\overline{LD}$ whichis also connected to one input terminal of NAND gate 80. NAND gate 80 is manufatured by Texas Instruments and identified as part no. ALS00. Connected to the other input terminal of NAND gate 80 is output RC (ripple carry output) of counter 60. Pins P and T of counter 60, which enable the latter, are connected to output $Q_3$ of counter 60. Counter 60 is powered by a +5 volt power supply. Connected to the output of NAND gate 80 is the clear ($\overline{CLR}$) input of counter 60 and an input terminal of OR gate 70. OR gate 70 is commercially available from Texas Instruments Corp. as part no. AS32. Connected to the other input terminal of OR gate 70 is the output terminal of XOR gate 50. A buffer and pulse shaper 90 is connected to the output of OR gate 70. The output from the buffer and pulse shaper 90 is connected to one of a plurality of high voltage pulsers, which drive one or more elements of transducer 100 for radiating an ultrasound wave as disclosed heretofore. As used herein the delay signal produced by device 10 is the signal at the output of OR gate 70.

For exemplary purposes only, a two hundred and thirty nanosecond delay will now be discussed. Reference throughout this discussion should be made to FIG. 3 which illustrates graphically certain waveforms produced by device 10 for a two hundred and thirty nanosecond delay relative to a leading edge (LE) of waveform $w_1$.

Initially, microprocessor 45 serially sends instructions stored in ROM 46 to shift register 40 in the form of an 8-bit word regarding (i) the value at which to initialize counter 60 (outputs $Q_0$–$Q_3$), (ii) whether to set XOR gate 50 as an inverter or buffer (output $Q_4$) and (iii) which one of the buffer inverters 20-24 multiplexer 30 is to select (outputs $Q_5$–$Q_7$). Microprocessor 45 also holds line T-$\overline{LD}$ at a low logic level (i.e. "0"). With pin $\overline{LD}$ at counter 60 at a low logic level, counter 60 is disabled from increasing its count value whereupon the initial value at which to begin the count is provided to inputs 0, 1, 2 and 3.

Whenever the initial value loaded into counter 60 from shift register 40 (which is represented by outputs $Q_3$, $Q_2$, $Q_1$, $Q_0$ of shift register (40) has a value of eight or greater, (that is, a binary value of 1000) pin $Q_3$ of counter 60 will be at a high logic level ("1"). Since pin $Q_3$ is connected to P and T of counter 60 the latter of which enable counter 60, once pin $Q_3$ of counter 60 is at a high logic level ("1") counter 60 is enabled. For purposes of a two hundred and thirty nanosecond delay a count value of "12" that is, a binary value of 1100 is loaded into counter 60. Once counter 60 has its initial value loaded, line T-$\overline{LD}$ will be pulled to a high logic level allowing counter 60 to begin counting the clock signals supplied to its CLK pin by XOR gate 50. It should be noted that the input of NAND gate 80 which is connected to line T-$\overline{LD}$ is now at a high logic level. As will be appreciated hereinafter, line T-$\overline{LD}$ is held at a low logic level for one hundred nanoseconds to ensure that one full cycle of waveform $w_0$ has been completed. While line T-$\overline{LD}$ is at a low logic level, multiplexer 30 is instructed to choose waveform $w_4$ by shift register 40 in order to obtain a two hundred thirty nanosecond delay after the first leading edge (LE) of waveform $w_1$ occurs following line T-$\overline{LD}$ changing to a high logic level as will be further explained below.

XOR gate 50 is designed to invert the signal supplied by multiplexer 30 when output $Q_4$ of shift register 40 is at a high logic level of 1. Consequently, anyone of the five waveforms ($w_1$, $w_2$, $w_3$, $w_4$ and $w_5$) at the output of by multiplexer 30 can be inverted by XOR gate 50 so as to reproduce waveforms $\overline{w}_1$, $\overline{w}_2$, $\overline{w}_3$, $\overline{w}_4$ and $\overline{w}_5$. Waveforms $w_1$-$w_5$ and $\overline{w}_1$-$\overline{w}_5$ are graphically illustrated in FIG. 2. In the present example, however, in order to produce a two hundred and thirty nanosecond delay, XOR gate 50 serves as a buffer as also will be appreciated hereinafter.

Of particular importance and as can be readily appreciated by referring to FIG. 2, by inverting waveforms $w_1$-$w_5$ an additional fifty nanosecond time shift relative to waveform $w_1$, in ten nanosecond increments, is obtained. Accordingly, by deciding which of the five waveforms to select and then whether or not to invert the same, a maximum total of a ninety nanosecond time shift relative to waveform $w_1$, in ten nanosecond increments, can be obtained using multiplexer 30 and XOR gate 50.

Counter 60 triggers (clocks) on the positive going edge, that is, the leading edge (LE) of the signal supplied from the output of XOR gate 50. Therefore, depending on which waveform is selected by multiplexer 30 in accordance with the select signals provided by shift register 40 at outputs $Q_5$-$Q_7$ of the latter thereof and depending on whether or not the waveform selected by multiplexer 30 is inverted or not by XOR gate 50, the positive going/leading edge of the waveform supplied by XOR gate to the clock input (CLK) of counter 60 can vary anywhere from zero nanoseconds to ninety nanoseconds, in ten nanosecond intervals, after the occurrence of the first positive going/leading edge of waveform $w_1$.

Since the signal provided by XOR gate 50 for incrementing counter 60 can occur up to ninety nanoseconds with respect to the leading edge of $w_1$ and in order to ensure that counter 60 begins counting relative to a leading edge of waveform $w_1$, (which defines zero delay), line T-$\overline{LD}$ is held low for an initial one hundred nanoseconds (relative to the first leading edge of waveform $w_1$) while counter 60 is being loaded. Thus counter 60 is prevented from inadvertently incrementing its count value until a leading edge of waveform $w_1$ reoccurs.

Each time counter 60 sees a leading edge (LE) of a waveform provided by XOR gate 50, counter 60 will increment the count value by one. Thus thirty nanoseconds after line T-$\overline{LD}$ goes high, that is, thirty nanoseconds after the leading edge of signal $w_1$ occurs the leading edge of waveform $w_4$ will appear at the CLK input of counter 60 incrementing the count value which was at a value of 12 to increase to a value of 13. One hundred nanoseconds thereafter the leading edge of waveform $w_4$ will reappear at the CLK input of counter 60 incrementing the count value to a value of 14. After an additional one hundred nanoseconds, counter 60 will once again increase its count by one to a value of 15. Thus a total two hundred and thirty nanoseconds has elapsed between the first leading edge of waveform $w_1$ following line T-$\overline{LD}$ changing to a high logic level and counter 60 reaching a value of 15. Upon counter 60 reaching a value of 15, the ripple carry output, that is, output RC of counter 60 will change from a logic level of "0" to "1".

Since line T-$\overline{LD}$ is already at a logic level of "1" and since pin RC is now also at a logic level of "1", the output of NAND gate 80 will be pulled from a high logic level to a low logic level of "0" which will result in OR gate 70 having an input supplied by NAND gate 80 at a logic level of 0. The other input to OR gate 70 is connected to the output of XOR gate 50. For the first fifty nanoseconds during which the output of NAND gate 80 is at a low logic level, the output from XOR gate 50, namely, waveform $w_4$ is at a high logic level. For the next fifty nanoseconds the output from XOR gate 50, namely waveform $w_4$ is at low logic level of "0". Accordingly, during this next fifty nanosecond interval both inputs to OR gate 70 will be at a low logic level of "0" resulting in the output from OR gate 70 changing from a high logic level to a low logic level of "0".

Buffered puse shaper 90 which is connected to the output of OR gate 70 is enabled whenever the output from OR gate 70 is at a low logic level. Therefore, for the fifty nanosecond interval during which the XOR gate 50's output and the NAND gate 80's output are at low logic levels, buffer and pulse shaper 90 drives transducer 100 from high voltage pulses for generating an ultrasound wave. As can now be appreciated, by initializing counter 60 at a count of 12 rather than 14 and providing waveform $w_4$ rather than $w_1$ to the CLK pin of counter 60, a two hundred and thirty nanosecond rather than zero nanosecond delay in the output signal (i.e. "delay signal") produced by OR gate 70 is achieved, respectively.

Once the output from NAND gate 80 changes from a high to low logic level, the CLR pin of counter 60 is ready to clear the count value of "15" from the counter and accept a new value to initiate the count once again. Counter 60, however, is a synchronous device and therefore requires a new positive going/leading edge received from XOR gate 50 before the count value is cleared. Thus pin RC will remain at a high logic level for one period of waveform $w_4$, that is, for one hundred nanoseconds. Upon counter 60 being cleared device 10 is ready to accept a new delay period based on a new 8 bit instruction word provided to shift register 40.

Although the above discussion has assumed a two hundred and thirty nanosecond delay, other delays can be obtained by changing (i) the waveform selected by multiplexer 30, (ii) inverting or not inverting the waveform selected by multiplexer 30 and (iii) changing the value at which to begin the count. For example, the following table illustrates the logic values to be written into shift register 40 and the waveform provided to counter 60 so as to obtain delays between zero to ninety, one hundred, two hundred, three hundred, three hundred and ninety, four hundred, five hundred and six hundred nanoseconds relative to waveform $w_1$.

| Delay in nanoseconds | Logic State of | | | | Waveform provided to Counter 60 | Logic State of | | | |
|---|---|---|---|---|---|---|---|---|---|
| | $Q_7$ | $Q_6$ | $Q_5$ | $Q_4$ | | $Q_3$ | $Q_2$ | $Q_1$ | $Q_0$ |
| 0 | 0 | 0 | 0 | 0 | $w_1$ | 1 | 1 | 1 | 0 |
| 10 | 0 | 0 | 1 | 0 | $w_2$ | 1 | 1 | 1 | 0 |
| 20 | 0 | 1 | 0 | 0 | $w_3$ | 1 | 1 | 1 | 0 |
| 30 | 0 | 1 | 1 | 0 | $w_4$ | 1 | 1 | 1 | 0 |
| 40 | 1 | 0 | 0 | 0 | $w_5$ | 1 | 1 | 1 | 0 |
| 50 | 0 | 0 | 0 | 1 | $\overline{w}_1$ | 1 | 1 | 1 | 0 |
| 60 | 0 | 0 | 1 | 1 | $\overline{w}_2$ | 1 | 1 | 1 | 0 |

-continued

| Delay in nanoseconds | Logic State of Q7 | Q6 | Q5 | Q4 | Waveform provided to Counter 60 | Logic State of Q3 | Q2 | Q1 | Q0 |
|---|---|---|---|---|---|---|---|---|---|
| 70  | 0 | 1 | 0 | 1 | $\underline{w}_3$ | 1 | 1 | 1 | 0 |
| 80  | 0 | 1 | 1 | 1 | $\underline{w}_4$ | 1 | 1 | 1 | 0 |
| 90  | 1 | 0 | 0 | 1 | $\underline{w}_5$ | 1 | 1 | 1 | 0 |
| 100 | 0 | 0 | 0 | 0 | $w_1$ | 1 | 1 | 0 | 1 |
| 200 | 0 | 0 | 0 | 0 | $w_1$ | 1 | 1 | 0 | 0 |
| 300 | 0 | 0 | 0 | 0 | $w_1$ | 1 | 0 | 1 | 1 |
| 390 | 1 | 0 | 0 | 1 | $\underline{w}_5$ | 1 | 0 | 1 | 1 |
| 400 | 0 | 0 | 0 | 0 | $w_1$ | 1 | 0 | 1 | 0 |
| 500 | 0 | 0 | 0 | 0 | $w_1$ | 1 | 0 | 0 | 1 |
| 600 | 0 | 0 | 0 | 0 | $w_1$ | 1 | 0 | 0 | 0 |

Of course, the number of time shifted waveforms produced by delay line 12 merely depends on the number of taps provided by delay line 12. Thus the more taps provided, the more time shifted waveforms are available. For instance, the ten mHz megahertz frequency of clock generator 11 can be applied to a delay line with one nanosecond increments. Thus by providing a multiplexer which will accept ten inputs and a counter with an increased count capability, the present invention could have a resolution of one nanosecond to as many as hundreds of nanoseconds as required. Obviously, by varying the frequency of the clock generator the time shifted increments between taps also can be varied.

Delay circuit 10 is used for each element which is to be fired after a predetermined period of time has elapsed. By timing all firings of all elements within the group of tranducers which form the ultrasound beam from a leading edge of waveform $w_1$, the prior art problems of inaccurately timed firings are eliminated. Rather, precisely timed firings of the elements are consistently obtained by the present invention. Furthermore, due to the parts used in the present invention being off the shelf items, the cost in manufacturing the present invention is minimal.

Having specifically described an illustrative embodiment of the invention with reference to the accompanying drawings, it is to be understood that the invention is not limited to those precise embodiments and that various changes and modifications may be effected by one skilled in the art without departing from the scope and spirit of the invention as defined by the appended claims.

I claim:

1. A timing circuit for producing a signal after a predetermined period of time has elapsed comprising:
    generating means for generating a periodic waveform, said waveform having leading and trailing edges;
    means responsive to said periodic waveform for producing a plurality of waveforms shifted in time relative to said periodic waveform, said shifted waveforms having leading and trailing edges;
    means responsive to said time shifted waveforms for inverting said time shifted waveforms;
    selecting means for selecting a waveform from a set including said time shifted waveforms and said inverted time shifted waveforms depending on the length of said predetermined period of time;
    counting means responsive to one of said edges of said selected waveform; and
    means responsive to said counting means for producing said signal when said counting means reaches a predetermined count value, said predetermined count value being dependent on said length of said predetermined period of time.

2. The timing circuit according to claim 1 wherein said selecting means comprises switching means for selecting said waveform and wherein said inverting means selectively inverts said selected waveform.

3. The timing circuit of claim 2 further comprising shift register means for controlling said selecting means and for setting an initial count value in said counting means from which said counting means is to begin.

4. The timing circuit according to claim 3 further comprising a computer for inputting values into said shift register depending on the waveform to be selected and the initial count value to be set into the counting means.

5. The timing circuit according to claim 1 wherein said generating means is a square wave generator.

6. The timing circuit according to claim 5 wherein said means for producing said time shifted waveforms comprises a digital delay line into which said periodic waveform from said generating means is inputed, said digital delay line having a plurality of output taps and buffer means for impedance matching said time shifted waveforms to the selecting means.

* * * * *